United States Patent [19]

Miller

[11] Patent Number: 4,695,791
[45] Date of Patent: Sep. 22, 1987

[54] AUTO RANGING OF A FREQUENCY MEASURING INSTRUMENT

[75] Inventor: Robert V. Miller, Dover, N.J.

[73] Assignee: Hewlett-Packard Company, Palo Alto, Calif.

[21] Appl. No.: 740,947

[22] Filed: Jun. 4, 1985

[51] Int. Cl.⁴ ............................................. G01R 23/10
[52] U.S. Cl. ............................ 324/78 D; 324/78 R; 364/484
[58] Field of Search ............... 324/77 R, 77 H, 78 R, 324/78 D, 115, 79 D; 364/484, 486; 377/19, 20; 455/67, 115, 226

[56] References Cited

U.S. PATENT DOCUMENTS

| | | | |
|---|---|---|---|
| 3,917,927 | 11/1975 | Minton | 324/78 D |
| 3,990,007 | 11/1976 | Hohhof | 324/78 D |
| 4,066,875 | 1/1978 | Ollington et al. | 324/78 D |
| 4,224,568 | 9/1980 | Griner | 364/484 |

Primary Examiner—Stewart J. Levy
Assistant Examiner—Kevin D. O'Shea
Attorney, Agent, or Firm—Donald N. Timbie

[57] ABSTRACT

An auto ranging system for causing an instrument for determining the frequency of a wave to be in a frequency mode or a period mode in response to the digits of the frequency of the wave determined in a trial interval. The cycles of the wave during which the cycles of an oscillator are counted during a period mode can also be selected from an examination of the digits.

6 Claims, 2 Drawing Figures

AUTO RANGING OF A FREQUENCY MEASURING INSTRUMENT

BACKGROUND OF THE INVENTION

There are two general modes in which the frequency of a wave can be measured. The number of cycles of the wave that occur during a given period of time can be counted or the number of cycles from a reference oscillator that occur during a given number of cycles of the wave can be counted. The first mode is called the frequency mode and the second is called the period mode. In the period mode the frequency of the wave is determined by dividing a given number of cycles of the wave by the number of cycles of an oscillator that occur during said given number of cycles and multiplying by the frequency of the oscillator. The resolution of a frequency measurement depends on the number of cycles that are counted. If there is sufficient time for making a measurement, any desired resolution can be obtained with either mode but if the measurement must be made in a short time, the frequency mode gives better solution for frequencies above a given value and the period mode gives better resolution for frequencies below that value. Furthermore, if the maximum frequency to be measured is greater than the highest frequency that can be handled by the counter circuitry, a frequency divider is connected ahead of the counter circuitry, but when the frequency of the wave equals this highest frequency, the frequency divider should be bypassed in order to obtain better resolution. When most instruments are operated in the period mode, it is possible to select different numbers of cycles of the wave being measured during which the cycles of the oscillator are counted. If only one number of cycles is available, the resolution of a measurement increases as the frequency of the wave being measured becomes lower, but the time required for the measurement also increases. By way of example, if cycles of a 10 MHz oscillator are counted during 1000 cycles of the wave, it would take 0.01 seconds to measure the frequency of a wave having a frequency of 100K and 100K counts would occur, but if the wave being measured has a frequency of 100 cycles, it would take ten seconds to make the measurement. Furthermore, the number of oscillator cycles occurring during this time would be 100M and might cause the counter to overflow. Thus it is advantageous to be able to reduce the number of cycles of a wave during which the cycles from the oscillator are counted.

Whereas placing the divider in or out of the circuit, the selection of the frequency mode or period mode of operation and the selection of the number of cycles of the wave being measured during which the cycles at the output of the oscillator are counted in a period mode of operation may be done manually, it would take considerable experimentation to obtain the right combination of these factors unless the frequency of the wave is approximately known, in which event the combination could be set in advance. In many applications there is not enough time to carry out the experimentation.

BRIEF DESCRIPTION OF THE INVENTION

This invention provides means and method whereby the unknown frequency of a wave that is anywhere within a wide range of frequencies can be measured with good resolution in a short time. In the embodiment to be described no measurement requires more than 1.5 seconds. The number of cycles occurring in the wave during a short trial interval are determined by the frequency mode or the period mode and groups of the digits of the number so obtained are respectively placed in different registers. In the particular embodiment of the invention described herein, the frequency mode is used during a trial interval of 0.1 seconds. The digits are then examined in sequence starting with the most significant, to determine the range of frequencies within which the wave lies. If the range is such that the frequency mode should be used, the cycles of the wave that occur during a predetermined measurement interval that is greater than the trial interval are counted; but if the range is such that the period mode should be used, the cycles emanating from a reference oscillator that occur during given number of cycles of the wave being measured are counted. In addition, the bypassing or not bypassing of the frequency divider is controlled if the frequency mode is selected, and the number of cycles of the wave being measured during which the oscillator output is to be counted is selected if the period mode is selected.

DETAILED DESCRIPTION OF THE INVENTION

Figure 1:
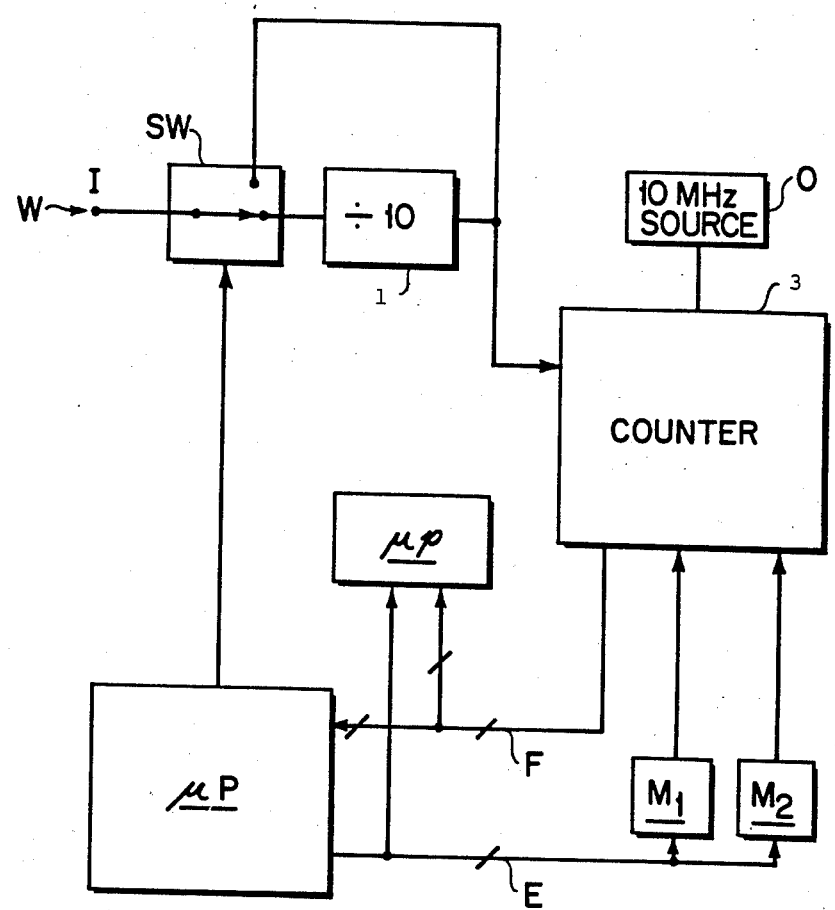
FIG. 1 is a block diagram of apparatus used in one embodiment of the invention.

In the block diagram of FIG. 1 the wave whose frequency is to be measured is applied to an input terminal I that is connected to a switch SW. When the switch SW is closed, the wave is applied via a divider 1, and when the switch SW is open, the wave is applied directly to a counter chip 3. In this particular embodiment of the invention, the counter circuit 3 is a counter chip 7226A.

A microprocessor uP, which in this particular embodiment is type 8049, sends digital commands via lines E and multiplexers $M_1$ and $M_2$ to the counter chip 3, and the chip 3 places bits representing frequency or period on data lines F which are connected to uP. The bits representing period or frequency are directly useful in themselves but the data lines F are also shown as being connected to a microprocessor $\mu p$ which can be programmed so as to derive the frequency or the period of the wave. In order for $\mu p$ to know when the bits on the data lines F relate to the actual measurement and not to the trial interval, it is supplied with the command bits on the line E. A reference oscillator 0 supplies 10 MHz pulses to an input of the counter chip 3.

Because the frequency of a wave applied to the input I may be much greater than the frequency of 10 MHz that can be handled by the counter chip 3, the switch SW is initially closed so that the wave is applied to the divider 1. Thus, frequencies up to 100 MHz may be measured. The switch SW is controlled by the microprocessor uP. When uP receives bits from the counter chip 3 during a trial interval indicating that the frequency of the wave is less than 10 MHz, it places the switch SW in its other position so that the divider 1 is bypassed.

Figure 2:
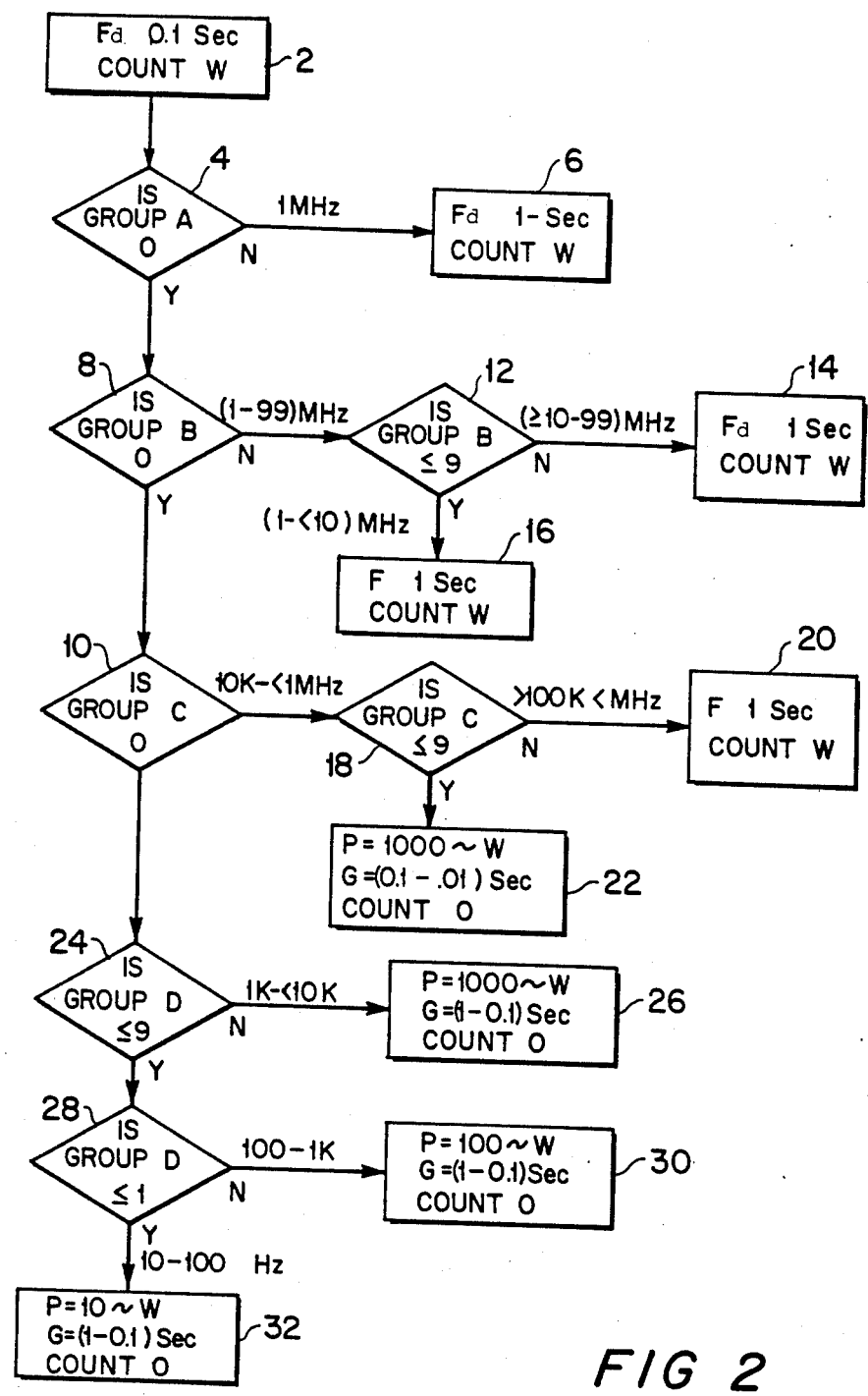
FIG. 2 is a flow chart illustrating one way for measuring the frequency of a wave in accordance with the principles of this invention.

Reference is now made to the flow chart of FIG. 2 in block form that describes one way in which this invention may be carried out. A letter d in a block indicator that the switch SW is in a position such as to place the divider 1 in the circuit. A letter F in a block indicates that the frequency mode is in operation, and "COUNT W" indicates that the cycles of the wave W are being counted. A letter P in a block indicates that the period mode is in operation, and "COUNT O" indicates that cycles from the reference oscillator O are being counted. The duration of the counting intervals are also shown. The letter G in a box indicates the time the gate is open. A program for the μp 8049 that will carry out the method represented by the flow chart is set forth at the end of the specification.

At the beginning of a measurement of the frequency of a wave W applied to the input I, the μp 8049 causes the switch SW to be closed, as indicated by the D in the block 2, and sends commands to the counter chip 3 that cause it to open a gate to which its input is connected for a trial interval of 0.1 seconds and to count the cycles of the wave W that pass through the gate. Thus, the counting is done in what is called the "frequency mode" as indicated by an F. The digits of the count emerging on the data lines F are divided into four groups A, B, C and D, the most significant group being A, and each group is loaded into a different register in μP. In this embodiment each group is a pair of digits. If, for example, the number is 1.01 MHz, the output of the counter will actually be 1.01 MHz because the divider 1 is in the circuit and because the gate is only open for 0.1 seconds. Thus the groups of digits that are placed in the respective registers are as indicated below. The commas are where they would be in 101 MHz, and the two digits at the right do not appear.

$$\underline{01}_{A} \quad \underline{01,}_{B} \quad \underline{00}_{C} \quad \underline{0.0}_{D}$$

Determination of the frequency of a wave W, in this case 101 MHz, is accomplished as follows. A decision block 4 indicates an examination of the digits in the group A to see whether or not both are zeros. In this case they would not be so that, as indicated by a block 6, the counter chip C is put into a frequency mode, the divider D is left in the circuit, and the cycles of the wave W are counted for one full second. It will be understood that other measuring intervals than one second could be used. When this count is completed, the digits on the data lines F of FIG. 1 now correspond to the frequency of the wave W. By noting the commands on the lines E, the microprocessor μP knows that these digits are for the frequency of the wave W and not the count that occurred during the trial interval. Even though the nominal maximum frequency that the counter chip 3 can handle with the divider D in the circuit is 100 MHz, some chips can go somewhat higher. Thus frequencies of the wave W that are ≧100 MHz are determined by the block 6.

If both digits in groups A are zero, it means that the frequency of W is <100 MHz and the digits of group B are examined as indicated by a decision block 8. If both digits of the group B are zeros, the μP proceeds to a decision block 10 to be discussed.

If, however, both digits in group B are not zero, it means that the frequency of W is above 1 MHz. It is already known that W is less than 100 MHz because of the affirmative answer given by the block 4. Thus the frequency of W is 1 MHz to 99 MHz inclusive.

Should the frequency of W go below 10 MHz, the switch SW should be changed so as to bypass the divider 1. This is accomplished in a decision block 12 which determines whether the number represented by both digits in group B is ≦9. If it is not, it can be seen that the frequency of W is 10 MHz or above. For example, if the frequency is 11 MHz, we have $$\underline{0 \; 0}_{A} \quad \underline{1 \; 1}_{B} \quad \underline{0 \; 0}_{C} \quad \underline{0 \; 0}_{D}$$

from which it can be seen that the number in B is 11 and therefore not ≦9. In this case the divider 1 remains in the circuit and the counter 3 is put into the frequency mode in which it counts the cycles at the output of the divider 1 for one second as indicated by a block 14.

On the other hand if the frequency is 8 MHz, the following situation prevails in which the number in B is 8.

$$\underline{0 \; 0}_{A} \quad \underline{0 \; 8}_{B} \quad \underline{0 \; 0}_{C} \quad \underline{0 \; 0}_{D}$$

Because this is less than 9, the μP places the switch SW in its other position so as to bypass the divider 1. This does not affect the count of W taken during the trial period however. With the divider 1 removed, the counter chip 3 counts the cycles in W for one second as indicated by a block 16.

If the digits of group B in the trial count are both zeros, the decision block 10 examines the digits in group C. If they are not both zeros, it can be seen by an analysis similar to the previous ones that the frequency of W must be 10K-<1 MHz inclusive.

As the crossover frequency at which the μP should cause the counter chip 3 to change from the frequency mode to the period mode is 100K for this particular embodiment, and therefore in the 10K to <1 MHz range, further analysis of the digits in group C is required. A decision block 18 checks to see if the number they form is ≦9. If not, the frequency of W is ≧100K so that the counter chip 3 is placed in the frequency mode in which it counts the cycles in the wave W for one second as indicated by a block 20. An example would be the frequency of exactly 101K illustrated below in which the number in group C is 10 and therefore >9.

$$\underline{0 \; 0}_{A} \quad \underline{0 \; 0}_{B} \quad \underline{0 \; 1}_{C} \quad \underline{1 \; 0}_{D}$$

If, however, the frequency of W is 99K, the groups of digits are as set forth below, in which the number in group C is 9.

$$\underline{0 \; 0}_{A} \quad \underline{0 \; 0}_{B} \quad \underline{0 \; 9}_{C} \quad \underline{9 \; 0}_{D}$$

In this case the answer in the decision block 18 is affirmative and the μP commands the counter chip 3 to switch to the period mode of counting in which the cycles from the source O are counted for 1000 cycles of the wave W as indicated by a block 22. As noted therein the gate in the counter chip 3 will be open for 0.1 seconds if the frequency is 10K and for 0.01 of a second if the frequency is just <100 MHz.

For frequencies of W that are less than 10K, the answer in the decision block 10 is affirmative because, as can be seen from the example below for 5K, both digits in the group C will be 0.

<u>0</u> <u>0</u> <u>0</u> <u>0</u> <u>0</u> <u>0</u> <u>5</u> <u>0</u>
 A      B      C      D

In this case the μP proceeds to a decision block 24.

The decision block 24 determines whether or not the number formed by the digits in group D are ≦9. If this is not true, the μP commands the counter chip 3 to count the cycles from the source O for 1,000 cycles of the wave W, block 26. If the frequency of W is slightly <10K, the gate in the counter chip C will be open for 0.1 seconds, and if the frequency of W is 1K, the gate will be open for 1 second. As can be seen by the example given immediately above for 5K, the number formed by the digits in group D is 50 and therefore >9 so that the cycles of the ocillator O would be counted for 1000 of 5K and the gate in 3 would be open for 0.2 seconds.

If, for example, the frequency of W is 800 cycles a second, the digits appear as follows so that the answer in the decision block 24 is affirmative because the number in group is <9 and μP proceeds to a decision block 28.

<u>0</u> <u>0</u> <u>0</u> <u>0</u> <u>0</u> <u>0</u> <u>0</u> <u>8</u>
 A      B      C      D

Decision block 28 examines the digits in group D to see if the number they represent is ≦1. If not, the frequency of W is between 100 and 1K, and μP commands the counter chip C to be in the period mode to count the cycles emanating from the source O for 100 cycles of W as indicated by a block 30. If W is 100 cycles, the gate in the counter chip 3 is open for 1 second, but if the frequency of W is 1K, the gate is open for 0.1 seconds.

If, however, the number represented by the group D is ≦1, the frequency of W is in the range of 10-100 Hz inclusive and μP commands the counter chip 3 to be in a period mode where, as indicated by a block 32, its gate is open for ten cycles of the wave W. If W is 10 cycles, the gate is open for 1 second 3, and if it is 100 cycles 3 the gate is open for 0.1 seconds.

Whereas the groups of digits in the particular embodiment of the invention described are pairs, groups having a different number of digits could be used in accordance with the invention.

The number of cycles in the wave can be derived during a trial interval by using the period mode of operation in which case the duration of the trial interval depends on the frequency of the wave. The lowest available number of cycles of the wave should be used to determine the time that the cycles of the oscillator are counted.

What is claimed is:

1. A method of measuring the frequency of a wave comprising
    counting the number of cycles occurring in the wave during a trial interval,
    placing different groups of digits from that number in different respective registers,
    examining the groups of digits in the registers so as to give a trial indication of the range of frequencies in which the wave lies,
    determining the frequency of the wave by a frequency mode if the trial indication of the range of frequencies in which the wave lies is above a given value or in a period mode if the trial indication of the frequencies in which the wave lies is less than the given value.

2. A method as set forth in claim 1 wherein the groups contain two digits.

3. A method as set forth in claim 1 wherein an oscillator is made to produce cycles of a given frequency and the number of cycles of the wave during which the cycles of the oscillator are counted in a period mode of measurement are respectively reduced in response to successively lower ranges of the trial indication.

4. A method as set forth in claim 1 wherein the number of cycles occurring in the wave during a trial interval is derived by the frequency mode of operation.

5. A method as set forth in claim 1 wherein the number of cycles in the wave occurring during a trial interval is derived by the period mode of operation.

6. Apparatus for selecting the best mode in which to make a frequency measurement comprising:
    an input gate to which a signal whose frequency is to be measured may be applied,
    means for opening the gate for a trial interval,
    means for counting the number of cycles of the signal that pass through the gate during the trial interval and indicating said number by a series of digits,
    means for examining groups of said digits in said number to determine the range in which the frequency of the wave lies,
    means responsive to the range determined by said examining means for indicating whether the frequency mode should be used or whether the period mode should be used, and
    means for deriving the frequency of the signal in accordance with the indicated mode.

* * * * *